United States Patent
Oyama et al.

(10) Patent No.: US 10,966,358 B2
(45) Date of Patent: Mar. 30, 2021

(54) COMPONENT MOUNTING DEVICE

(71) Applicant: FUJI CORPORATION, Chiryu (JP)

(72) Inventors: Shigeto Oyama, Kariya (JP); Toshiya Ito, Nishio (JP); Toshinori Shimizu, Kariya (JP); Masaki Murai, Nishio (JP); Masashi Hayakawa, Okazaki (JP); Satoshi Shioya, Okazaki (JP); Toshihiko Yamasaki, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 457 days.

(21) Appl. No.: 15/326,777

(22) PCT Filed: Jul. 18, 2014

(86) PCT No.: PCT/JP2014/069203
§ 371 (c)(1),
(2) Date: Jan. 17, 2017

(87) PCT Pub. No.: WO2016/009557
PCT Pub. Date: Jan. 21, 2016

(65) Prior Publication Data
US 2017/0215309 A1  Jul. 27, 2017

(51) Int. Cl.
*H05K 13/00* (2006.01)
*H05K 13/08* (2006.01)
(Continued)

(52) U.S. Cl.
CPC ..... *H05K 13/0015* (2013.01); *H05K 13/0061* (2013.01); *H05K 13/0069* (2013.01);
(Continued)

(58) Field of Classification Search
CPC .......... H05K 13/0015; H05K 13/0061; H05K 13/046; H05K 13/08; H05K 13/0812;
(Continued)

(56) References Cited

U.S. PATENT DOCUMENTS 5,646,825 A * 7/1997 Huttenlocher ..... H05K 7/20681
165/104.33
7,087,457 B2 * 8/2006 Ogata ............... Y10T 29/49131
29/833

(Continued)

FOREIGN PATENT DOCUMENTS

JP  10-335391 A   12/1998
JP  2000-312069 A  11/2000
(Continued)

OTHER PUBLICATIONS

Machine Translation of Japanese Patent Publication, JP 2002-1181489, Sep. 2019 (Year: 2019).*

(Continued)

Primary Examiner — A. Dexter Tugbang
(74) Attorney, Agent, or Firm — Oblon, McClelland, Maier & Neustadt, L.L.P.

(57) ABSTRACT

A component mounting device includes a heater unit which heats along a range which is narrower than a movement range of a head and which is a partial length of a board, in which the head is controlled to mount components onto the board using a heating range of the heater as a mounting range, the board is conveyed to shift the mounting range every time mounting of components in the mounting range is completed such that an unmounted range in which components are not mounted on the board becomes the mounting range, and components are mounted in a new mounting range.

11 Claims, 15 Drawing Sheets

(51) Int. Cl.
*H05K 13/04* (2006.01)
*H05K 7/20* (2006.01)

(52) U.S. Cl.
CPC ........... *H05K 13/046* (2013.01); *H05K 13/08* (2013.01); *H05K 13/083* (2018.08); *H05K 13/0812* (2018.08); *H05K 13/0815* (2018.08); *H05K 13/0882* (2018.08); *H05K 7/20145* (2013.01); *H05K 7/20681* (2013.01); *Y10T 29/49131* (2015.01); *Y10T 29/53174* (2015.01); *Y10T 29/53178* (2015.01); *Y10T 29/53191* (2015.01); *Y10T 29/53261* (2015.01)

(58) Field of Classification Search
CPC ............. H05K 13/0815; H05K 13/083; H05K 7/20145; H05K 7/20681; H05K 13/0882; H05K 13/0069; Y10T 29/49131; Y10T 29/53174; Y10T 29/53191; Y10T 29/53261; Y10T 29/53178
See application file for complete search history.

(56) References Cited

U.S. PATENT DOCUMENTS

| | | | | |
|---|---|---|---|---|
| 7,251,883 B2* | 8/2007 | Nakamura | ......... | H05K 13/0812 29/834 |
| 2009/0000112 A1* | 1/2009 | Ikushima | ............. | H05K 13/046 29/791 |
| 2009/0277002 A1* | 11/2009 | Wada | ................. | H05K 13/0061 29/739 |
| 2009/0293265 A1* | 12/2009 | Inoue | ................ | Y10T 29/53174 29/739 |
| 2012/0036711 A1* | 2/2012 | Ban | ................... | Y10T 29/53174 29/832 |
| 2012/0240388 A1* | 9/2012 | Ishimoto | ............ | H05K 13/0061 29/593 |
| 2015/0089805 A1* | 4/2015 | Ayotte | ............. | Y10T 29/53178 29/840 |

FOREIGN PATENT DOCUMENTS

| | | |
|---|---|---|
| JP | 2002-118149 A | 4/2002 |
| JP | 2003-188599 A | 7/2003 |
| JP | 2006278714 A * | 10/2006 |
| JP | 2011-199184 A | 10/2011 |
| WO | WO 91/11093 A1 | 7/1991 |

OTHER PUBLICATIONS

International Search Report dated Oct. 7, 2014, in PCT/JP2014/069203, filed Jul. 18, 2014.

Office Action dated May 22, 2018 in corresponding Japanese Patent Application No. 2016-534071, 3 pages.

Extended European Search Report dated Jun. 30, 2017 in Patent Application No. 14897802.6.

* cited by examiner

COMPONENT MOUNTING DEVICE

TECHNICAL FIELD

The present application relates to a component mounting device.

BACKGROUND ART

In the related art, regarding component mounting devices which mount components onto boards, there is known a component mounting device which mounts components while performing a specific process during the component mounting. For example, in a component mounting device of PTL 1, a heater is embedded in a stage onto which a board is placed, a heater is embedded in a head which presses a component, and by pressing the component using the head while driving the heaters to heat the entire surface of the board in a state in which the component is disposed on the board via a thermosetting adhesive, the component is mounted using thermocompression bonding.

CITATION LIST

Patent Literature

PTL 1: JP-A-2000-312069

SUMMARY

As in the component mounting device described above, although it is possible to enable performing a specific process such as a heating process once on the entire surface of the board, since the range over which the specific process is performed widens depending on the size of the board, this leads to an increase in the size of the processing device such as a heater for performing the specific process, and the installation space of the processing device increases, the installation cost increases, and the like.

The main object of the present disclosure is to appropriately mount components while limiting the range over which a specific process which is necessary for the mounting of the components is performed.

The present disclosure adopts the following means in order to achieve the above-described main object.

A component mounting device of the present disclosure is a component mounting device which mounts components onto a board using a head, including conveyance device for conveying the board, holding device for holding the board which is conveyed, specific processing device for performing, from under the board which is held, a specific process which is necessary for mounting of the components in a specific range which is a range which is narrower than a movement range of the head and which is narrower than amounting surface of the board, and control device for repeating a mounting process and a shifting process until mounting of the components on the mounting surface is completed, in which in the mounting process, the control device controls the head and the specific processing device to mount the components using the specific range of the mounting surface as a mounting range, and in which in the shifting process, the control device controls the conveyance device and the holding device to shift the mounting range by releasing holding of the board and conveying the board, and to subsequently hold the board.

The component mounting device of the present disclosure repeats the mounting process in which components are mounted using the specific range in which the specific process is performed as the mounting range, and the shifting process in which the mounting range is shifted by releasing the holding of the board and conveying the board and the board is subsequently held until the mounting of components onto the mounting surface of the board is completed. Accordingly, even if a configuration which enables the performing of the specific process in a single pass across the entire range of the mounting surface of the board is not adopted, it is possible to appropriately mount the necessary components.

In the component mounting device of the present disclosure, the specific processing device may be configured such that the specific range is a fixed range which spans in a direction which is perpendicular to a conveyance direction of the board in the mounting surface, and the control device may perform the shifting process every time the mounting process in the mounting range is completed. In this case, it is possible to mount the necessary components using a simple process in which the shifting process and the mounting process are repeated alternately.

In the component mounting device of the present disclosure of this aspect, the holding device may include a clamp member which partially clamps the board, and the clamp member may be formed such that a length in the conveyance direction in a portion which clamps the board is greater than or equal to a length in the conveyance direction in the specific range. In this case, it is possible to suppress the occurrence of clamping marks on the board which arise from repeated clamping of the same portion of the board. In a case in which a heating process is performed as the specific process, since the stretching of the board caused by heating is not restricted more than necessary, it is possible to prevent the occurrence of warping in the board and to stabilize the component mounting accuracy of the components.

Alternatively, in the component mounting device of the present disclosure, the specific processing device may be configured such that the specific range is capable of moving in at least one of the conveyance direction of the board and a direction which is perpendicular to the conveyance direction, and the control device may divide and set a range in which the specific range is capable of moving into a plurality of the mounting ranges, control movement of a specific range of the specific processing device such that the mounting process is sequentially performed in each of the mounting ranges, and perform the shifting process when the mounting process is completed in all of the mounting ranges. In this case, when mounting components, since the repeating of the releasing of the holding of the board and the holding of the board is reduced, it is possible to efficiently mount components in a case in which the range in which the specific process is performed is restricted.

In the component mounting device of the present disclosure of this aspect, the holding device may include a clamp member which partially clamps the board, and the clamp member may be formed such that a length in the conveyance direction in a portion which clamps the board is greater than or equal to a length in the conveyance direction in a range in which the specific range is set as the movable range. In this case, it is possible to suppress the occurrence of clamping marks on the board which arise from repeated clamping of the same portion of the board. In a case in which a heating process is performed as the specific process, since the stretching of the board caused by heating is not restricted more than necessary, it is possible to prevent the occurrence of warping in the board and to stabilize the component mounting accuracy of the components.

The component mounting device of the present disclosure may further include a first moving mechanism which causes the head to move in a conveyance direction of the board, and a second moving mechanism which causes the head to move in a direction which is perpendicular to the conveyance direction, in which the control device controls the first moving mechanism and the second moving mechanism such that, after receiving a supply of the component, the head passes a predetermined position and moves to a mounting position of the component in the mounting process, and in which when the head moves from the predetermined position to the mounting position, the specific range of the specific processing device may be defined such that both a movement direction of the head by the first moving mechanism and a movement direction of the head by the second moving mechanism become fixed directions. In this case, since it is possible to fix the direction of the shifting of the stopping position of the head when mounting components in the mounting range, it is possible to easily perform shifting correction and the like of the stopping position of the head, and thus, it is possible to improve the mounting accuracy of the components.

In the component mounting device of the present disclosure, the specific processing device may include a heater which partially heats the board as the specific process, and a base block on which the heater is installed via a thermally insulating material, and the component mounting device may further include cooling medium circulation device for causing a cooling medium to circulate inside the base block. In this case, it is possible to prevent an increase in the size of the heater and to suppress the influence of the heat reaching the parts of the component mounting device. It is possible to suppress the heat of the heater being transmitted to the parts of the component mounting device via the base block.

The component mounting device of the present disclosure of this aspect may further include suction device for sucking air in a periphery of the heater. In this case, it is possible to promote heat exhausting in the periphery of the heater, and to further suppress the influence of heat on the portion of the periphery of the heater.

The component mounting device of the present disclosure of this aspect may further include blowing device for blowing air toward a periphery of a portion of the board which is heated by the heater. In this case, it is possible to suppress the influence of the heat reaching a range other than the mounting range in which the specific process is performed on the board.

DESCRIPTION OF EMBODIMENTS

Figure 1:
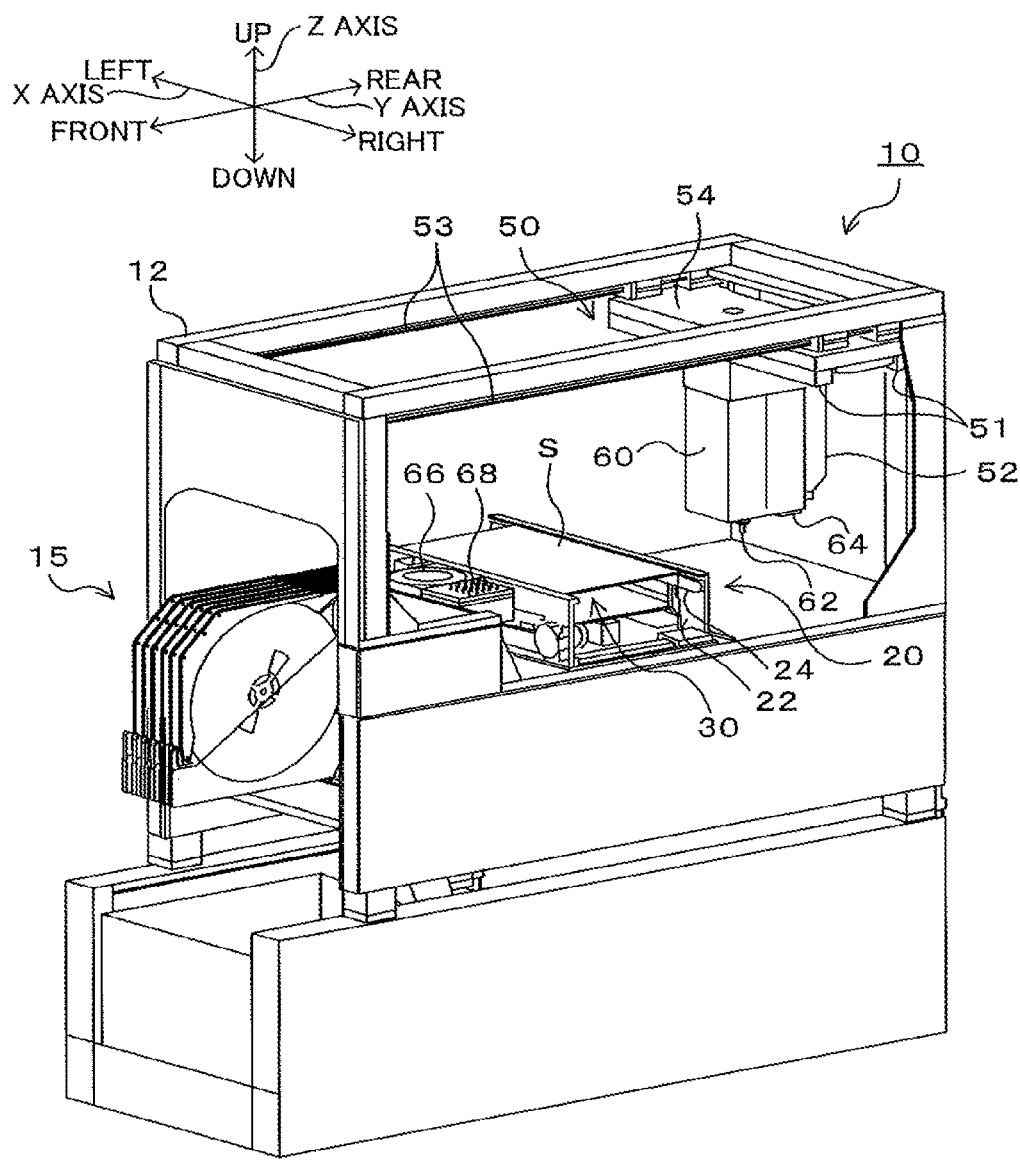
FIG. 1 is a configuration diagram schematically illustrating the configuration of a component mounting device 10.
Figure 2:
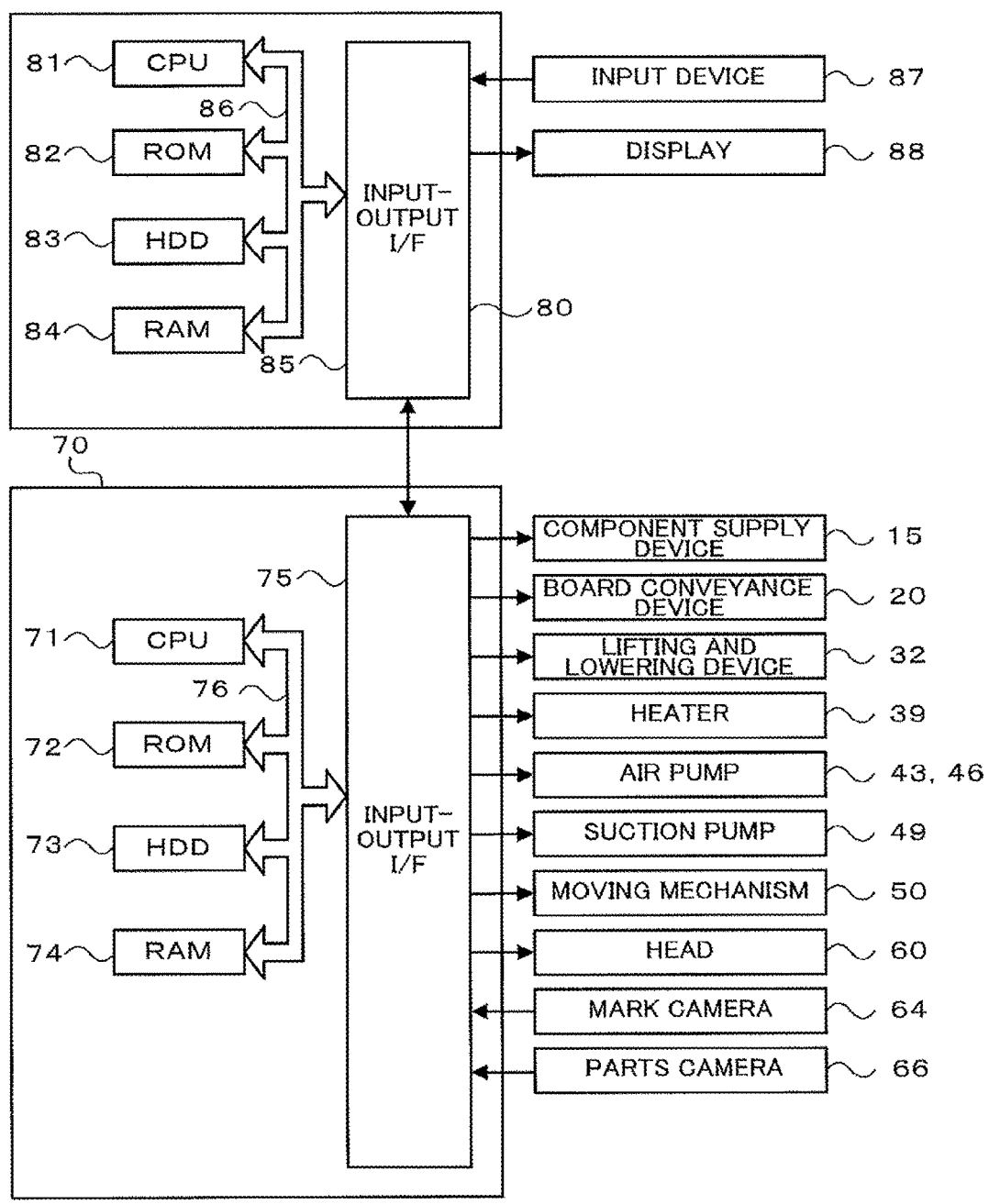
FIG. 2 is a block diagram illustrating the configuration relating to the control of the component mounting device 10.

Next, description will be given of embodiments the present disclosure using the drawings. FIG. 1 is a configuration diagram schematically illustrating the configuration of the component mounting device 10, and FIG. 2 is a block diagram illustrating the configuration relating to the control of the component mounting device 10. A left-right direction of FIG. 1 is an X-axis direction, a forward-backward direction is a Y-axis direction, and an up-down direction is a Z-axis direction.

Figure 3:
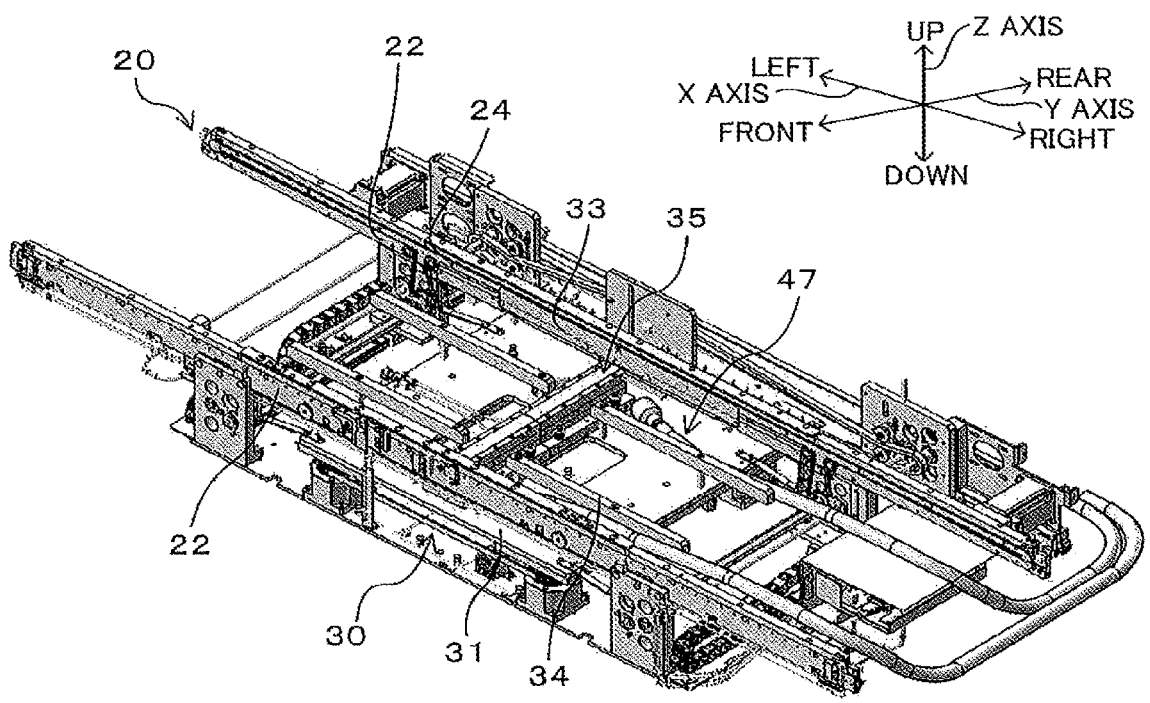
FIG. 3 is a configuration diagram schematically illustrating the configuration of a board conveyance device 20 and a board holding device 30.
Figure 4:
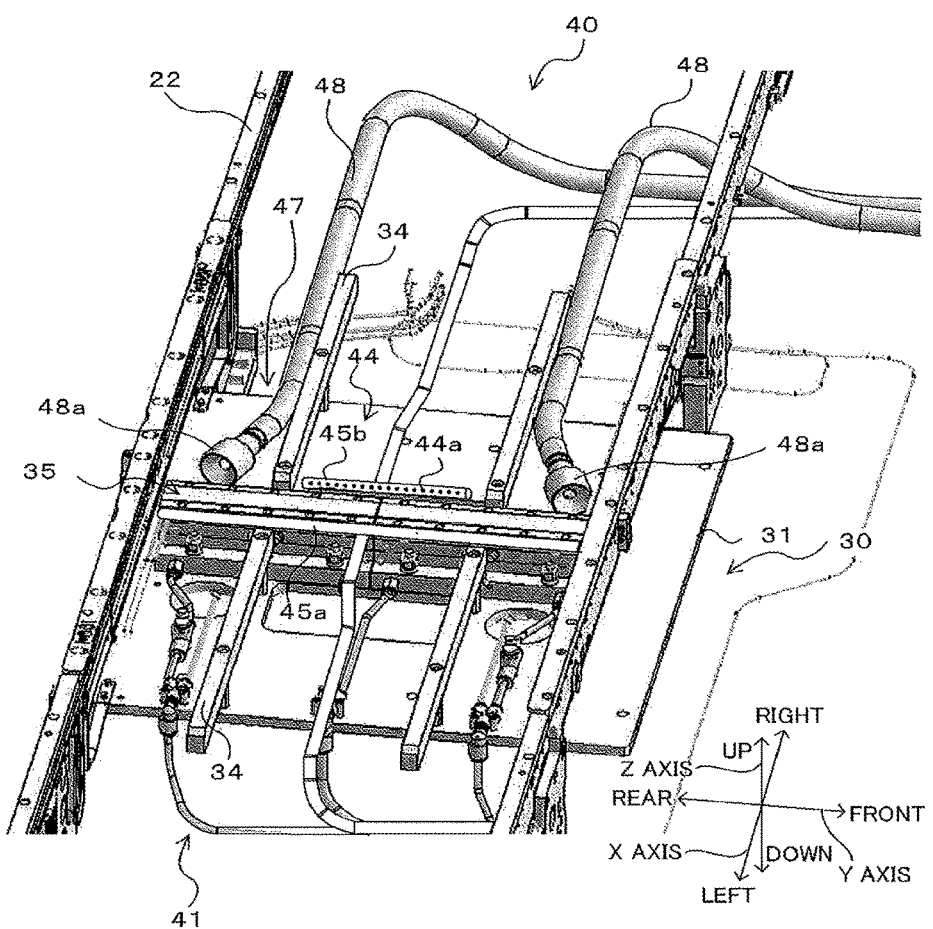
FIG. 4 is an enlarged diagram of the configuration of the vicinity of the center portion of FIG. 3.
Figure 5:
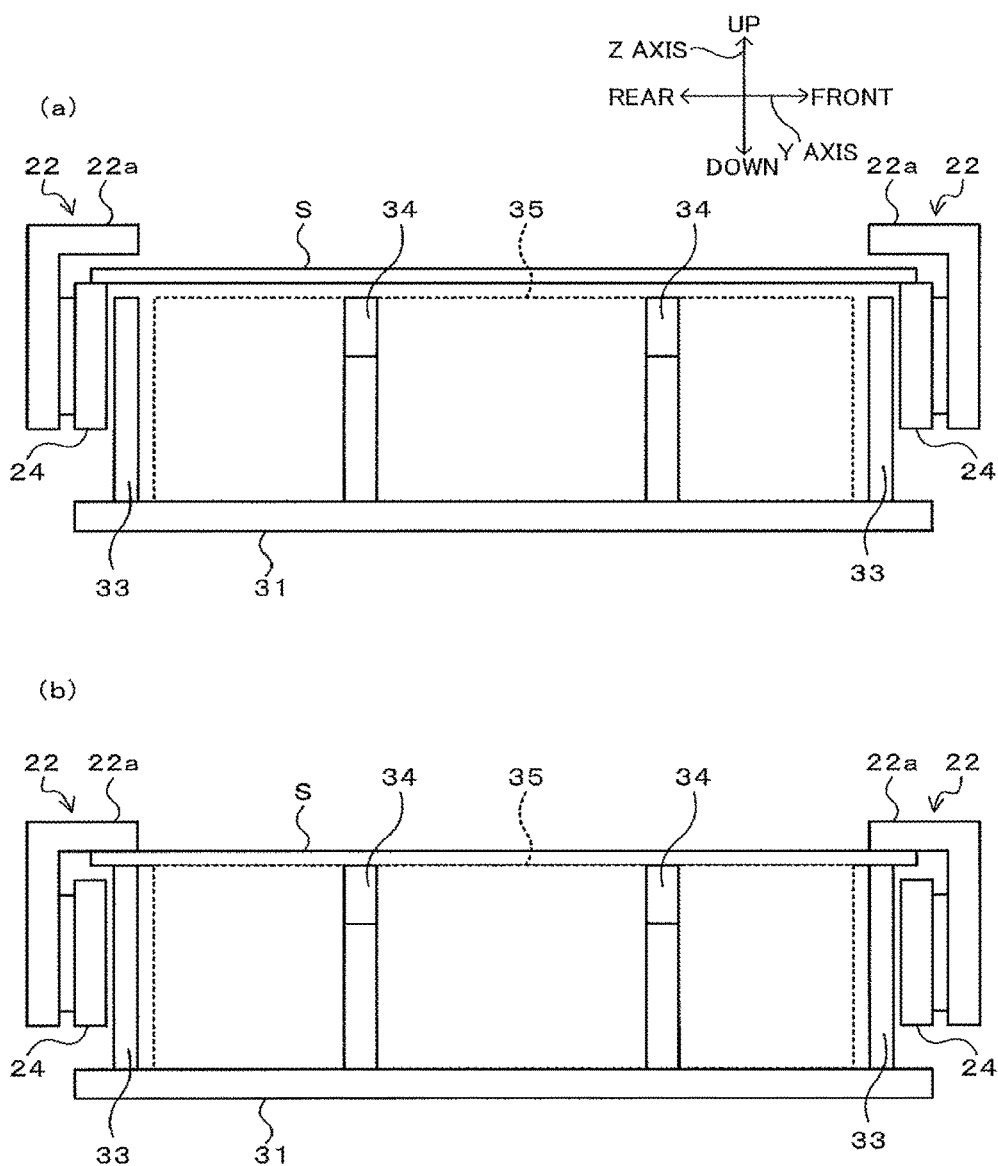
FIG. 5 is a sectional diagram of the configuration of the board holding device 30.
Figure 6:
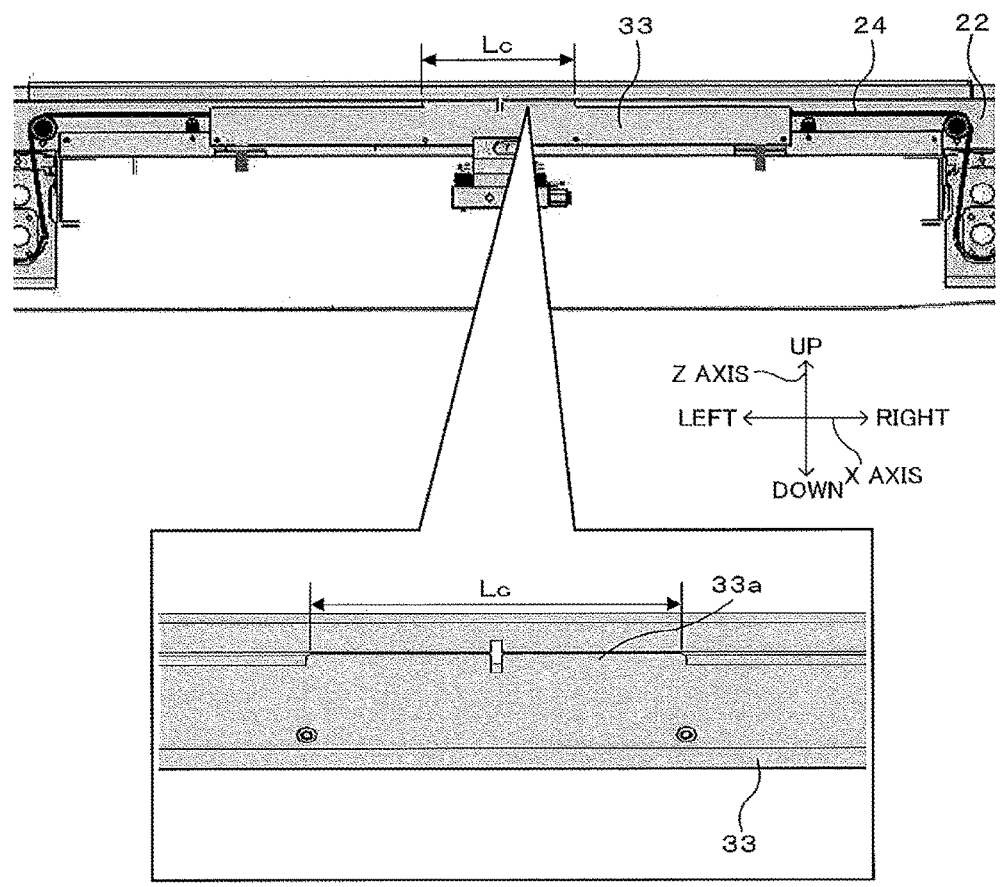
FIG. 6 is an explanatory diagram illustrating the shape of a clamp plate 33.
Figure 7:
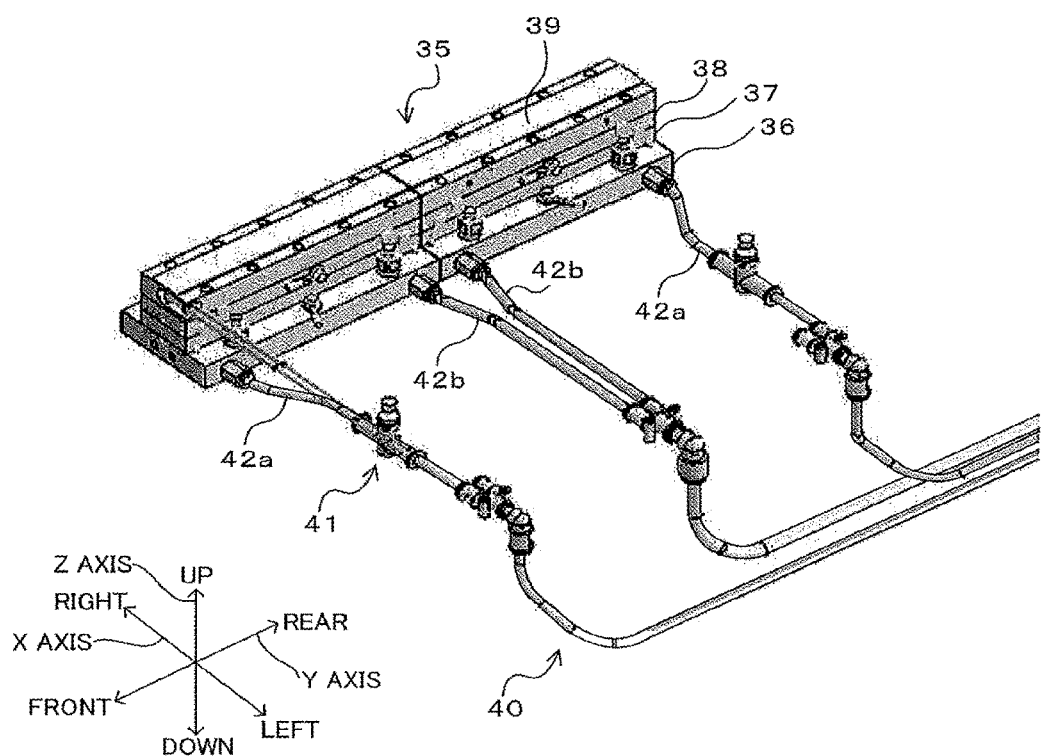
FIG. 7 is a configuration diagram schematically illustrating the configuration of a heater unit 35 and a cooling unit 40.
Figure 8:
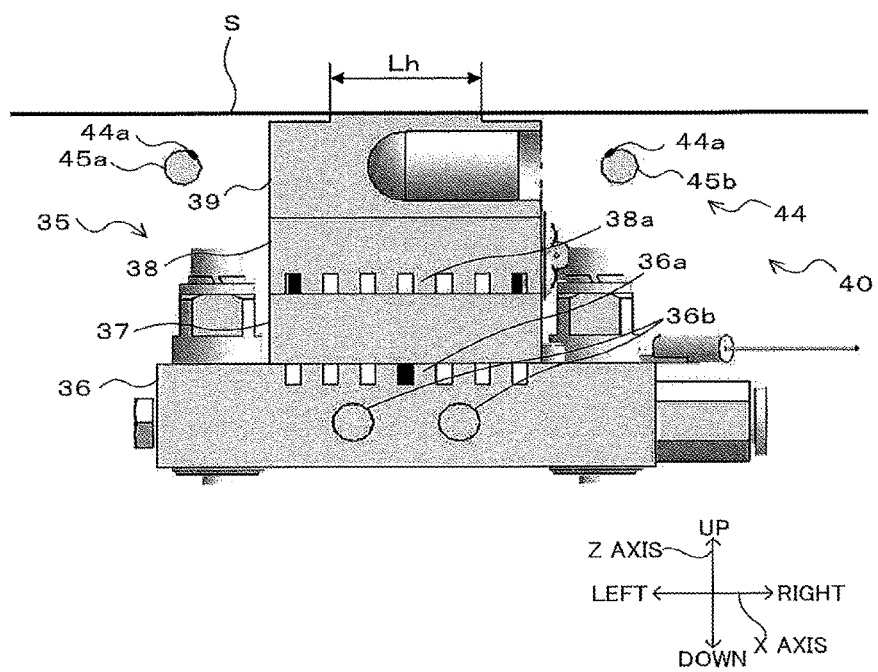
FIG. 8 is a configuration diagram schematically illustrating the configuration of the heater unit 35 and the cooling unit 40.

As illustrated in FIG. 1, the component mounting device 10 is provided with a component supply device 15 which is provided with a reel which stores components and the like, the board conveyance device 20 which conveys the board S which has a sheet shape, the board holding device 30 which holds the board S which is conveyed, a head 60 which sucks the component which is supplied from the component supply device 15 using a suction nozzle 62 and mounts the component onto the board S, a moving mechanism 50 which causes the head 60 to move, a mark camera 64 which is capable of imaging various marks which are attached to the board S, a parts camera 66 which is capable of imaging the component which is sucked the suction nozzle 62, a nozzle station 68 for stocking a plurality of the suction nozzles 62, and the control device 70 (refer to FIG. 2) which manages the overall control of the component mounting device 10. Here, FIG. 3 is a configuration diagram schematically illustrating the configuration of the board conveyance device 20 and the board holding device 30, FIG. 4 is an enlarged diagram of the configuration of the vicinity of the center portion of FIG. 3, FIG. 5 is a sectional diagram of the configuration of the board holding device 30, FIG. 6 is an explanatory diagram illustrating the shape of the clamp plate 33, and FIGS. 7 and 8 are configuration diagrams schematically illustrating the configuration of the heater unit 35 and the cooling unit 40. FIG. 5A illustrates a sectional diagram in which the board holding device 30 is not holding a board, and FIG. 5B illustrates a sectional diagram in which the board holding device 30 is holding (is clamping) a board.

As illustrated in FIGS. 1 and 3, the board conveyance device 20 is provided with a belt conveyor 24 which is provided on each of a pair of side frames 22, and a driving device which is not illustrated which drives the belt conveyor 24, and the board S is conveyed from the left to the right (a board conveyance direction) of FIGS. 1 and 3 through the driving of the belt conveyors 24. The pair of side frames 22 have a cross section which is bent into an inverted L shape, and are disposed such that upper horizontal sections 22a face each other. The horizontal sections 22a are parallel to the belt conveyors 24, and overhang above the outer edge portion of the board S which is conveyed by the belt conveyor 24 (refer to FIG. 5).

As illustrated in FIG. 4, the board holding device 30 is configured as a device installed in which are the clamp plate 33 (refer to FIG. 5) which is installed, to be capable of being lifted and lowered along the left and right side frames 22, on a base plate 31 which is sheet shaped and is installed to be capable of being lifted and lowered by a lifting and lowering device 32 (refer to FIG. 2), a plurality of (in FIG. 4, four) board support members 34 which are provided along the board conveyance direction, the heater unit 35 which is a substantially rectangular parallelepiped shape, and the cooling unit 40 for suppressing the transmission and diffusion of heat which is emitted from the heater unit 35 to the periphery.

As illustrated in FIG. 5A, the board holding device 30 is configured such that the upper surface of the clamp plate 33 and the upper surface of the board support member 34 become the same height. Therefore, as illustrated in FIG. 5B, in the board holding device 30, when the base plate 31 is lifted due to the operation of the lifting and lowering device 32, the clamp plate 33 and each of the board support members 34 comes into contact with the bottom surface of the board S to push up the boards. In the present embodiment, the upper surface of the heater unit 35 is also configured to become approximately the same height as the upper surfaces of the clamp plate 33 and the board support member 34. The outer edge portion of the board S which is lifted is interposed between the upper surface of the clamp plate 33 and the bottom surfaces of horizontal sections 22a of the side frames 22. Accordingly, the board holding device 30 clamps the board S (the outer edge portion).

As illustrated in FIG. 6, a protruding section 33a which partially protrudes upward is formed in the center of the X-axis direction (the board conveyance direction) of the upper surface of the clamp plate 33, and the clamp plate 33 clamps the board S due to the protruding portion 33a coming into contact with the bottom surface of the board S. A length Lc in the X-axis direction of the protruding section 33a is shorter than the length in the X-axis direction of the board S. Therefore, the clamp plate 33 partially clamps the board S instead of the entire length (the entire width) of the board S.

As illustrated in FIGS. 7 and 8, the heater unit 35 is configured such that a thermally insulating material 37, an upper level block 38, and the heater 39 in which a heating element is embedded are stacked in order on a base block 36 which is placed on the base plate 31 and in which an air flow path 36b is formed. Cooling fins 36a and 38a are formed on the surfaces of the base block 36 and the upper level block 38 which are in contact with the thermally insulating material 37, respectively. Therefore, it is possible to suppress the transmission of heat from the heater 39 of the topmost level to the base block 36 of the bottommost level using the cooling fins 36a and 38a and the thermally insulating material 37. Examples of the material of the thermally insulating material 37 include a thermally insulating resin material such as phenol resin which is reinforced using machinable ceramics, glass fibers, or the like. Here, the length in the Y-axis direction (the direction orthogonally intersecting the board conveyance direction) of the heater 39 is the length spanning between the pair of belt conveyors 24; however, a length Lh in the X-axis direction (the board conveyance direction) of the heater 39 is shorter than the length in the X-axis direction of the board S. Therefore, the heating range of the heater 39 becomes a partial range of the mounting surface of the board S instead of the entire surface of the mounting surface of the board S. Specifically, the heating range of the heater 39 becomes a rectangular range which covers the entire width in the Y-axis direction of the mounting surface of the board S and which is narrower than the width in the X-axis direction of the mounting surface of the board S. In the present embodiment, the protruding section 33a of the clamp plate 33 which is described earlier is formed such that the length Lc in the X-axis direction thereof is approximately the same as the length Lh in the X-axis direction of the heater 39. The protruding section 33a is formed such that the position in the X-axis direction of the protruding section 33a substantially matches the position in the X-axis direction of the heater 39.

As illustrated in FIGS. 4, 7, and 8, the cooling unit 40 is provided with an air circulation unit 41 which causes air to circulate in the air flow path 36b inside the base block 36, an air blower unit 44 which blows air onto the board S, and a vacuum unit 47 which sucks air in the vicinity of the heater unit 35.

The air circulation unit 41 is formed of an air supply pipe 42a which allows air which is a cooling medium to flow into the air flow path 36b of the base block 36 and an air discharge pipe 42b into which air which is discharged from the air flow path 36b flows, and an air pump 43 (refer to FIG. 2) which pumps out air to the air supply pipe 42a. The air circulation unit 41 causes air to circulate in the air flow path 36b through the driving of the air pump 43 to cool the base block 36, and is mainly capable of suppressing the transmission of heat from the base block 36 to the base plate 31.

The air blower unit 44 is formed of an upstream-side blow pipe 45a which is disposed on the upstream side of the heater unit 35 in the board conveyance direction and in which a plurality of small holes 44a which blow out air are formed, a downstream-side blow pipe 45b which is disposed on the downstream side of the heater unit 35 in the board conveyance direction and in which the plurality of small holes 44a which blow out air are formed, and an air pump 46 (refer to FIG. 2) which pumps out air to the upstream-side blow pipe 45a and the downstream-side blow pipe 45b. The air blower unit 44 blows air from the upstream-side blow pipe 45a and the downstream-side blow pipe 45b onto the board S through the driving of the air pump 46, and is mainly capable of suppressing the diffusion of heat from the board S.

The vacuum unit 47 is formed of an air vacuum pipe 48 which is disposed downstream of the heater unit 35 in the board conveyance direction, and a suction pump 49 (refer to FIG. 2) which is connected to the air suction pipe 48. In the present embodiment, the air suction pipes 48 are disposed one by one between the board support member 34 and the side frame 22 (the belt conveyor 24), and an opening end 48a of each of the air suction pipes 48 is provided in a state of being inclined to the side frame 22 side. The vacuum unit 47 sucks the air in the periphery of the heater 39 through the driving of the suction pump 49 to suppress the rising of the temperature in the periphery of the heater 39. Since the vacuum unit 47 of the present embodiment is provided in a state in which the opening end 48a is inclined to the side frame 22 side, in particular, it is possible to suppress heat transmission to the side frame 22 (the belt conveyor 24).

As illustrated in FIG. 1, the moving mechanism 50 is provided with a Y-axis guide rail 53 which is provided along the Y-axis direction on a top level portion of a main body frame 12, a Y-axis slider 54 which is capable of movement along the Y-axis guide rail 53, an X-axis guide rail 51 which is provided along the X-axis direction on a bottom surface of the Y-axis slider 54, and an X-axis slider 52 which is capable of movement along the X-axis guide rail 51 and to which the head 60 is attached. The moving mechanism 50 causes the head 60 to move in an XY-plane (in a horizontal plane which is parallel to the plate surface of the board S) of the main body frame 12. The X-axis guide rail 51 and the Y-axis guide rail 53 are configured to, for example, cause each of the sliders 52 and 54 to move, respectively, using a ball screw mechanism which uses a servomotor as the drive source, cause each of the sliders 52 and 54 to move, respectively, using a linear motor as the driving source, or the like.

As illustrated in FIG. 2, the control device 70 is configured as a microprocessor mainly including the CPU 71, and in addition to the CPU 71, is provided with a ROM 72, an HDD 73, a RAM 74, and an input and output interface 75. These are electrically connected via a bus 76. An image signal from the mark camera 64, an image signal from the parts camera 66, and the like are input to the control device 70 via the input and output interface 75. On the other hand, a drive signal to the component supply device 15, a drive signal to the board conveyance device 20, a drive signal to the lifting and lowering device 32 of the board holding device 30, a drive signal to the heater 39 of the heater unit 35, a drive signal to the air circulation unit 41 of the cooling unit 40 or the air pumps 43 and 46 of the air blower unit 44, a drive signal to the suction pump 49 of the vacuum unit 47 of the cooling unit 40, a drive signal to the moving mechanism 50, a drive signal to the head 60, and the like are output from the control device 70 via the input and output interface 75. The control device 70 is connected to be capable of bidirectional communication with a management device 80 via a communication network, and the transaction of data and control signals is performed therebetween.

For example, the management device 80 is a general-purpose computer, and is provided with a CPU 81, a ROM 82, an HDD 83, a RAM 84, and an input and output interface 85. These are electrically connected via a bus 86. The management device 80 receives input of input signals from an input device 87 such as a mouse or a keyboard via the input and output interface 85, and image signals are output from the management device 80 to a display 88 via the input and output interface 85. The HDD 83 stores the production plan of the board S. The production plans of the board S refer to plans defining which components to mount in which positions of the mounting surface of the board S in which order in the component mounting device 10, how many boards S onto which the components are mounted in this manner are to be manufactured, and the like. The management device 80 outputs command signals to the control device 70 such that the components are mounted according to the production plan.

Figure 9:
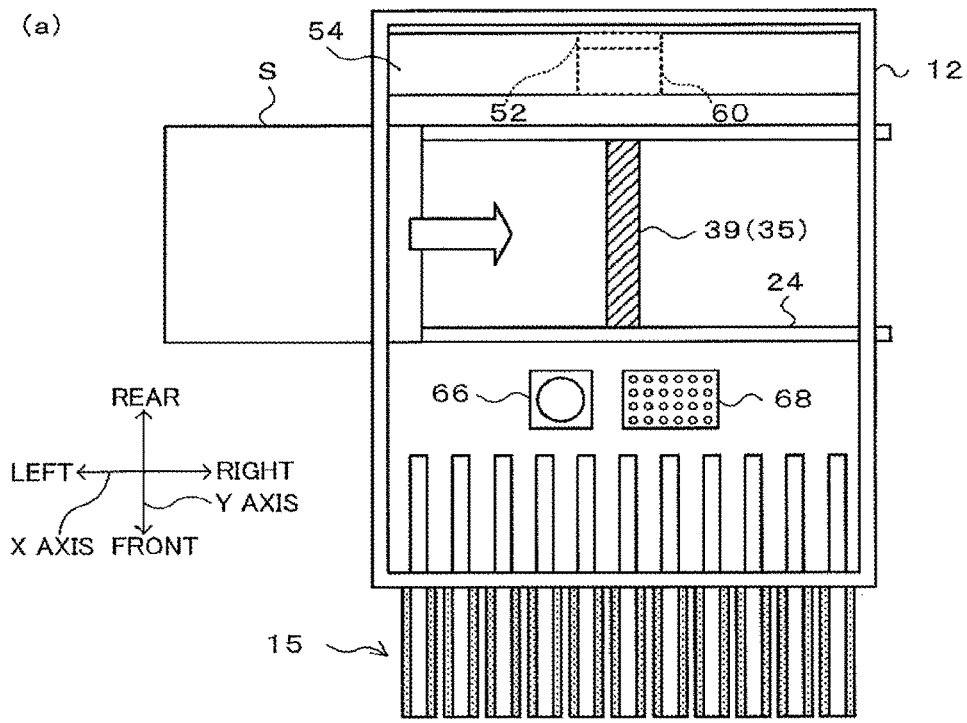
FIG. 9 is an explanatory diagram illustrating a mounting range of a board S.
Figure 9:
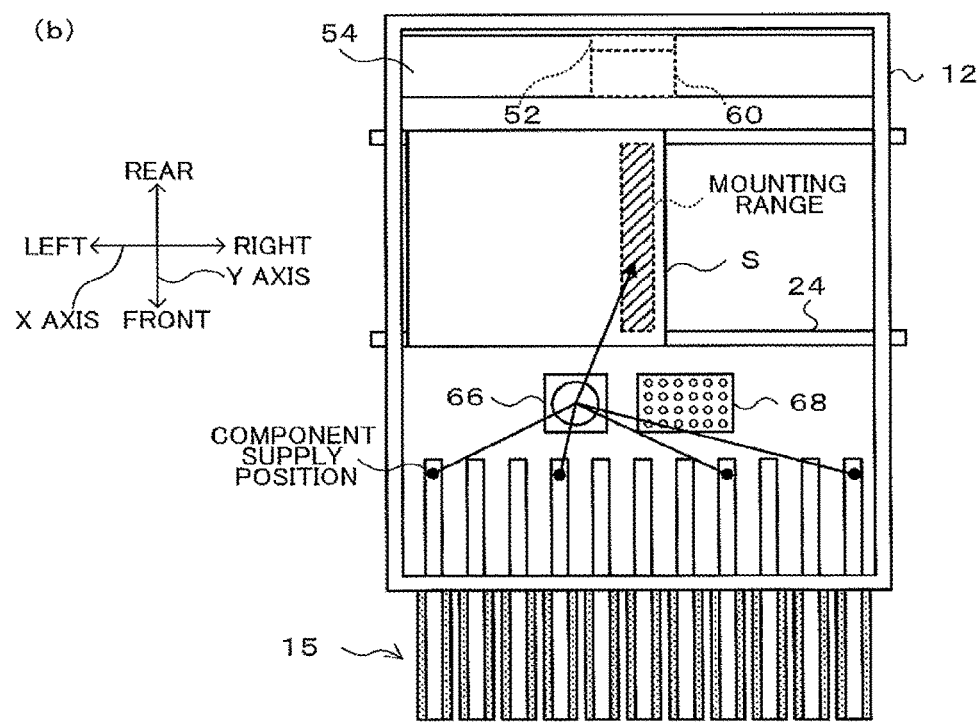

Here, in the present embodiment, a thermosetting adhesive is applied to the mounting positions of the components on the mounting surface of the board S, and the component mounting device 10 is capable of mounting the components onto the board S by placing the components while using the heater 39 to heat the board S (the adhesive) from the bottom surface of the board S. In this case, the mounting range in which it is possible to mount the components (mountable range) becomes a range which matches the heating range of the heater 39. FIG. 9 is an explanatory diagram illustrating the mounting range of the board S. FIG. 9A is before the carrying in of the board S, and FIG. 9B is after the carrying in of the board S. As illustrated in FIG. 9B, since the mounting range becomes a rectangular range corresponding to the heating range of the heater 39, the mounting range becomes a narrower range than the mounting surface of the board S. Since the head 60 is capable of moving in the XY-plane of the main body frame 12 due to the moving mechanism 50, the mounting range becomes a narrower range than the range in which the head 60 is capable of moving. Therefore, when the mounting of components in the mounting range is completed, the component mounting device 10 conveys the board S, shifts the range in which the components are not mounted to the mounting surface of the board S into the mounting range, and mounts the components using the new range as the mounting range. Therefore, the number of mounting ranges into which to render the mounting surface, which order which components are to be mounted onto which positions of each mounting range, how much of a conveyance amount by which to convey the board S when the mounting of the components in each mounting range is completed, and the like are defined in the production plan of the board S onto which the thermosetting adhesive is applied.

Figure 10:
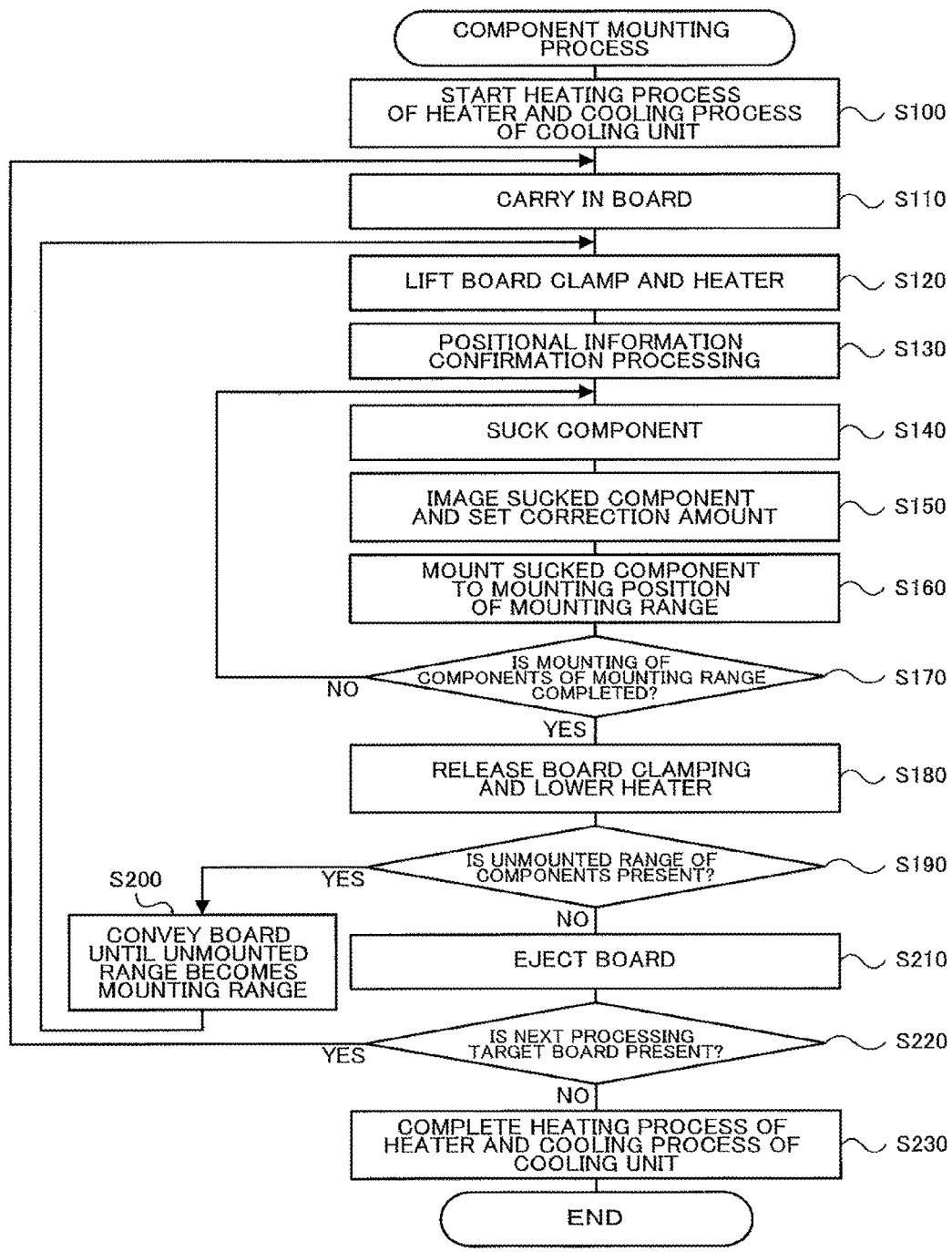
FIG. 10 is a flowchart illustrating an example of a component mounting process which is executed by a CPU 71 of a control device 70.

Next, description will be given of the operations of the component mounting device 10 which is configured in this manner. FIG. 10 is a flowchart illustrating an example of a component mounting process routine which is executed by the CPU 71 of the control device 70. When the CPU 71 of the control device 70 receives a command signal from the management device 80, the CPU 71 executes this routine.

In the component mounting process, the CPU 71 first controls the heater 39 so as to start the heating process and controls the cooling unit 40 so as to start the cooling process (S100). The process of S100 is performed by outputting a drive signal to the heater 39 and outputting drive signals to the air pumps 43 and 46 and the suction pump 49. When the cooling process is performed, the cooling medium (air) circulates inside the base block 36, air is blown out upward, and the air which is heated in the vicinity of the heater unit 35 is sucked. Next, the CPU 71 controls the board conveyance device 20 to carry in the board S to a position (refer to FIG. 9B) at which the range in which the components on the board S are to be mounted becomes within the heating range of the heater 39 (S110). Next, the CPU 71 controls the lifting and lowering device 32 to cause the base plate 31 to be lifted, and thus, the board S is clamped by the clamp plate 33 and the heater 39 is caused to come into contact with the bottom surface of the board S (S120). The CPU 71 reads the reference position marks Sa corresponding to the current mounting range of the board S, and performs a positional information confirmation process which performs confirmation (S130).

Figure 11:
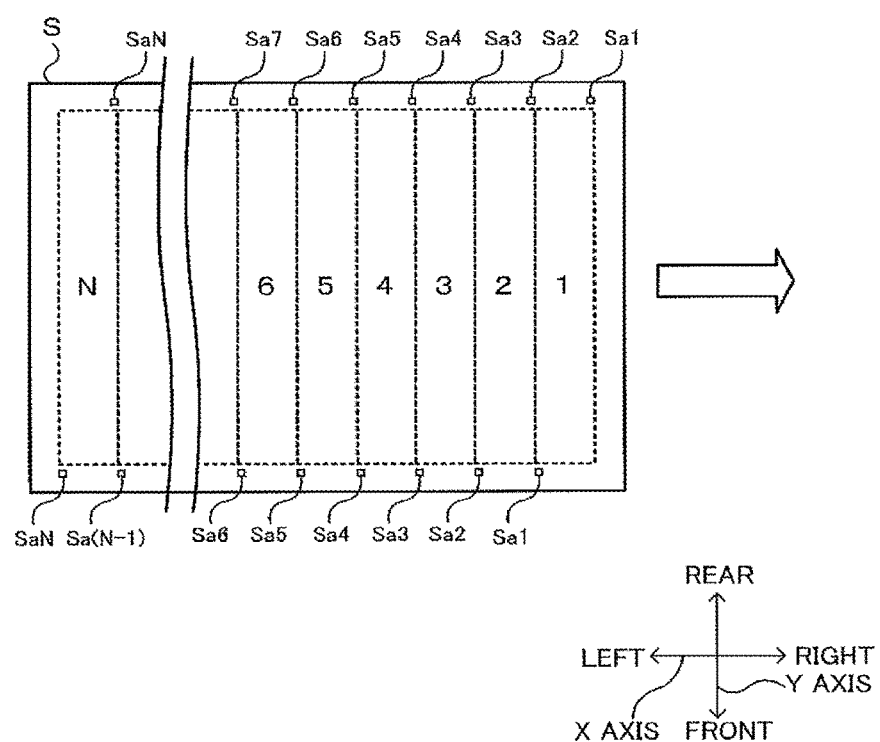
FIG. 11 is an explanatory diagram illustrating the relationship between the mounting range of the board S and reference position marks Sa.

FIG. 11 is an explanatory diagram illustrating the relationship between the mounting range on the board S and reference position marks Sa. As described earlier, since the shifting of the board S is repeated such that an unmounted range in which components are not mounted onto the board S becomes the mounting range, FIG. 11 illustrates a state in which the range over which the components are to be mounted onto the board S is divided into a plurality of (N) mounting ranges. In the present embodiment, the reference position marks Sa are formed in advance, one for each of two corners (the top right and the bottom left of FIG. 11) which are opposing corners of each of the plurality of mounting ranges. For example, a reference position mark Sa1 which corresponds to a mounting range 1 at the beginning of the right end in the drawing is formed at each of the top right and the bottom left of the mounting range 1, and a reference position mark SaN which corresponds to a mounting range N at the end of the left end in the drawing is formed at each of the top right and the bottom left of the mounting range N. In the process of S130, the CPU 71 causes the mark camera 64 (the head 60) to move such that one of the two reference position marks Sa of the mounting range which serves as the processing target fits within the visual field of the mark camera 64, images one of the reference position marks Sa, causes the mark camera 64 to move such that the other of the reference position marks Sa of the mounting range which serves as the processing target fits within the visual field of the mark camera 64, images the other of the reference position marks Sa, and processes each of the obtained images. Accordingly, the CPU 71 is capable of confirming that the mounting range is in a position for performing the mounting of the components, and mounting the components in the mounting positions which are designated by the command signals, using the reference position marks Sa as references.

When the positional information confirmation processing is performed in this manner, the CPU 71 controls the component supply device 15, the moving mechanism 50, and the head 60 to supply the component to the component supply position of the component supply device 15 and to cause the supplied component to be sucked by the suction nozzle 62 (S140). Next, the CPU 71 controls the moving mechanism 50 to cause the head 60 to move above the parts camera 66, images the component which is sucked by the suction nozzle 62 using the parts camera 66, processes the obtained image, and sets a correction amount in relation to the mounting position of the component based on the suction deviation amount of the component (S150). Next, the CPU 71 controls the moving mechanism 50 and the head 60 to mount the sucked component to the mounting position of the mounting range based on the set correction amount and the correction amount of the stopping position of the head 60 which is set in advance (S160), and determines whether or not the mounting of the components in the mounting range which is the processing target is completed (S170). Here, in the present embodiment, the mounting range is a limited range, and as illustrated in FIG. 9B, the mounting range is positioned on the rear of the right side (above the right side of the drawing) as viewed from the parts camera 66. Therefore, in a case in which the head 60 moves from each component supply position of the component supply device 15 to a mounting position of the mounting range via above the parts camera 66 to mount a component, the movement direction of the head 60 from the parts camera 66 becomes a single direction to the right side in the X-axis direction, and becomes a single direction toward the rear in the Y-axis direction. Therefore, the shifting of the stopping position which is based on the configuration of the X-axis slider 52 and the Y-axis slider 54 (mechanical looseness of the guide rails, slipping during the stopping of the sliders, and the like) only occurs in one direction for both the X-axis direction and the Y-axis direction, respectively. Therefore, by obtaining, in advance, the deviation amounts of each of the X-axis direction and the Y-axis direction, it is possible to accurately derive the correction amount of the stopping position. The correction amounts which are derived in this manner are stored in the HDD 73, and the CPU 71 reads and uses the correction amounts in S160.

When the CPU 71 determines that the mounting of components in the mounting range is not completed in S170, the CPU 71 repeats the processes of S140 to S170. When the CPU 71 determines that the mounting of components in the mounting range is completed, the CPU 71 controls the lifting and lowering device 32 to cause the base plate 31 to be lowered, and thus, releases the clamping by the clamp plate 33 of the board S and causes the heater 39 to separate from the bottom surface of the board S (S180). Next, the CPU 71 determines whether or not an unmounted range, in which components are not mounted in the range in which components are to be mounted onto the board S, is present (S190).

When the CPU 71 determines that an unmounted range is present, the CPU 71 controls the board conveyance device 20 to shift the mounting range by conveying the board S until the unmounted range becomes the mounting range (S200). In this case, the shifting amount is set to an amount corresponding to the length Lh (the width of the heating range) in the X-axis direction of the heater 39 such that a components-mounted range, in which it is determined that the mounting of components is completed in S170, assumes a position just outside of the heating range of the heater 39. Accordingly, as illustrated in FIG. 11, the mounting ranges 1 to N which are adjacent with no gap from the upstream side to the downstream side in the conveyance direction are sequentially set on the board S. The shift amount is not limited to this, and may be set to an amount at which at least a portion of the unmounted range becomes the mounting range, and may be set to an amount at which of the positions at which to next mount a component, a position on the most upstream side in the conveyance direction becomes the mounting range. When the board S is shifted, the CPU 71 returns to S120, clamps the board S using the clamp plate 33 and causes the heater 39 to come into contact with the bottom surface of the board S, and subsequently performs the processes of S130 onward. In this manner, CPU 71 repeats the shifting of the mounting range and the mounting process of components until there are no more unmounted ranges on the board S.

Here, when the conveying of the board S is repeated to shift the mounting range, the clamping and the releasing of the clamping of the board S are repeated. In the present embodiment, since the protruding section 33a is formed on the clamp plate 33 and the board S is partially clamped, even if the clamping and the releasing of the clamping of the board S are repeated, it is possible to prevent the same location of the board S from being repeatedly clamped. Therefore, it is possible to suppress the occurrence of clamping marks (damage) on the board S. Since the position of the protruding section 33a matches the position in the X-axis direction of the heater 39, and the length Lc in the X-axis direction of the protruding section 33a is approximately the same as the length Lh in the X-axis direction of the heater 39, the stretching of the board S, which is heated by the heater 39, in the X-axis direction is not restricted more than necessary while reliably clamping the mounting range of the board S. Therefore, since the stretching of the board S is not restricted and it is possible to suppress the board S being warped or the like, the mounting position being shifted due to warping of the board S is prevented and it is possible to obtain an improvement in the mounting accuracy.

While repeating the processes of S120 to S190, when the CPU 71 determines that there are no unmounted ranges on the board S in S190, that is that the mounting of components onto the board S is completed, the CPU 71 controls the board conveyance device 20 to eject the board S (S210). The CPU 71 next determines whether or not the board S which will serve as the processing target is present (S220), and when the CPU 71 determines that the board S which will serve as the processing target is present, the CPU 71 returns to S110 and repeats the processes. On the other hand, when the CPU 71 determines that the board S which will serve as the processing target is not present, the CPU 71 completes the heating process of the heater 39 and completes the cooling process of the cooling unit 40 (S230), and ends the component mounting process routine.

Here, the correspondence relationship between the constituent elements of the present embodiment and the constituent elements of the present disclosure will be made clear. The head 60 of the present embodiment corresponds to a head of the present disclosure, the board conveyance device 20 corresponds to conveyance device, the board holding device 30 corresponds to holding device, the heater unit 35 corresponds to specific processing device, and the CPU 71 of the control device 70 which executes the component mounting process routine of FIG. 10 corresponds to control device. The clamp plate 33 which interposes the board S between the bottom surfaces of the horizontal sections 22a of the side frames 22 and the clamp plate 33 corresponds to a clamp member. The X-axis slider 52 corresponds to a first moving mechanism, and the Y-axis slider 54 corresponds to a second moving mechanism. The heater 39 corresponds to a heater, the base block 36 corresponds to a base block, and the air circulation unit 41 corresponds to cooling medium circulation device. The vacuum unit 47 corresponds to suction device. The air blower unit 44 corresponds to blowing device.

The component mounting device 10 of the present embodiment which is described above is provided with the heater unit 35 which heats a range which is narrower than the movement range of the head 60 which is a partial range of the board S using the heater 39, controls the head 60 to mount components onto the board S using the heating range of the heater 39 as the mounting range, conveys the board S to shift the mounting range every time the mounting of components of the mounting range is completed, and mounts components in a new mounting range. Therefore, even if the heater unit 35 is not configured such that the heater 39 is capable of heating the entire surface of the board S, the component mounting device 10 is capable of conveying the board S and repeatedly mounting components to appropriately mount the components which are necessary onto the board S.

In a case in which the head 60 which receives the supply of components at the component supply position of the component supply device 15 moves once to above the parts camera 66 and subsequently moves to the mounting range, since the movement direction of each of the X-axis direction and the Y-axis direction becomes a single direction (a fixed direction), it is possible to cause the shifting of the stopping position of the head 60 when mounting a component to easily occur in a single direction. Therefore, the correction of the deviation amount of the stopping position of the head 60 is performed comparatively easily, and it is possible to improve the mounting accuracy of the components.

Since the clamp plate 33 clamps the board S using the protruding section 33a, it is possible to prevent the clamp plate 33 from repeatedly clamping the same location of the board S, and to suppress the occurrence of clamping marks on the board S. Since the clamp plate 33 does not restrict the stretching of the board S which is heated more than necessary by clamping the board S using the protruding section 33a, it is possible to prevent the board S from warping and the mounting accuracy of the component from decreasing.

Since the air circulation unit 41 which causes air to be circulated inside the base block 36 in which the heater 39 is installed is provided, it is possible to suppress the influence of the heat of the heater 39 reaching the parts of the component mounting device 10 via the base plate 31. Since the vacuum unit 47 which sucks the air in the periphery of the heater 39 is provided, it is possible to promote heat exhausting in the periphery of the heater 39. Since the air blower unit 44 which blows air toward the periphery of the portion at which the heater 39 heats the board S is provided, it is possible to suppress the influence of the heat reaching other locations than the mounting range in which the mounting of components is being performed. Therefore, it is possible to suppress the influence of the heat reaching the components which are mounted earlier.

The present disclosure is not in any manner limited to the embodiment described above, and it goes without saying that the present disclosure may be carried out in various modes within the technical scope of the present disclosure.

For example, in the embodiment described above, the length Lc in the X-axis direction of the protruding section 33a of the clamp plate 33 is set to be approximately the same as the length Lh in the X-axis direction of the heater 39, and the clamping range is matched to the heating range in the X-axis direction of the heater 39; however, the embodiment is not limited thereto, and a configuration may be adopted in which the clamping range of the protruding section 33a of the clamp plate 33 is set such that at least a portion overlaps the heating range in the X-axis direction of the heater 39. The length Lc in the X-axis direction of the protruding section 33a may be set to be greater than or equal to the length Lh in the X-axis direction of the heater 39.

In the embodiment described above, only a single protruding section 33a is formed on the upper surface of the clamp plate 33; however, the embodiment is not limited thereto, and a plurality of protruding sections may be formed. Instead of one, a plurality of the heater units 35 may be provided, and in this case, a plurality of protruding sections may be formed in positions corresponding to the positions in the X-axis direction of the respective ones of the plurality of heaters.

Figure 12:
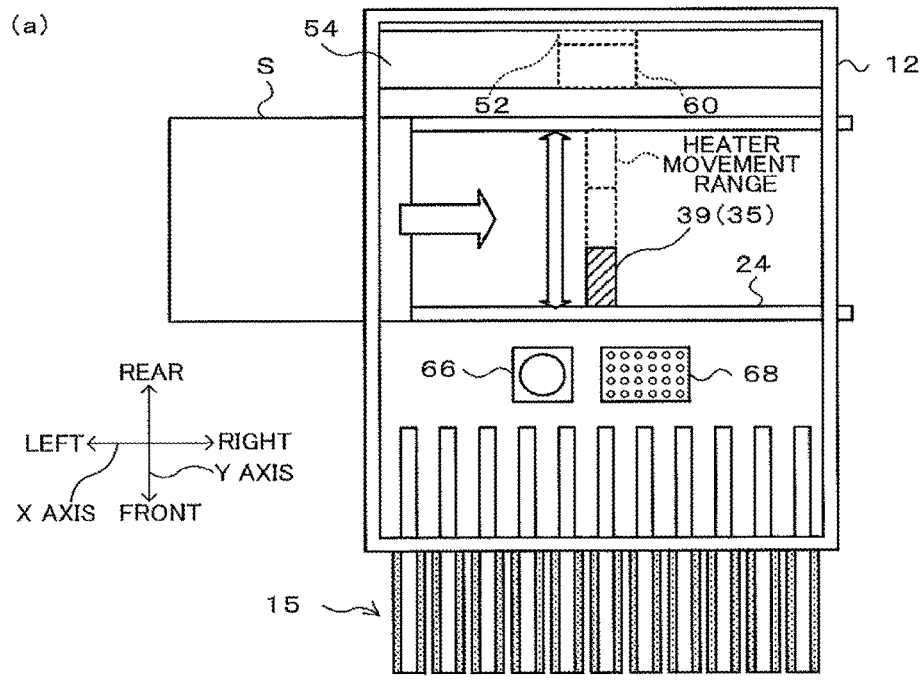
FIG. 12 is an explanatory diagram illustrating a movement range of a heater 39 of an alternative embodiment.
Figure 12:
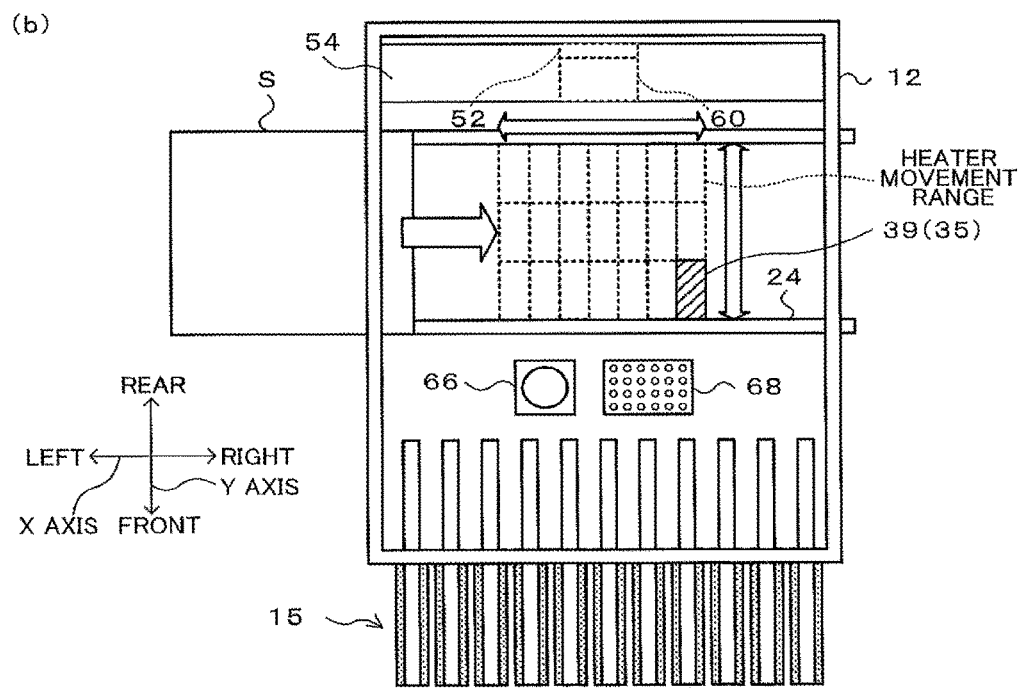

In the embodiment described above, the heater 39 (the heater unit 35) does not move in the XY-directions; however, the embodiment is not limited thereto, and the heater 39 may move in either of the X-direction and the Y-direction, or in both. FIG. 12 is an explanatory diagram illustrating the movement range of the heater 39 of the alternative embodiment. FIG. 12A illustrates a state in which the heater 39 is not capable of moving in the X-direction and is capable of moving in the Y-direction, and FIG. 12B illustrates a state in which the heater 39 is capable of moving in the X-direction and the Y-direction. In the alternative embodiment, the length in the X-direction of the heater 39 is set to the same length Lh as in the embodiment described above, and the length in the Y-direction of the heater 39 is set to a length of approximately ⅓ between the conveyors 24. Therefore, a mountable range (the heating range) of the alternative embodiment becomes approximately ⅓ of the embodiment. In the example of FIG. 12A, the heater 39 is configured to be capable of shifting two times backward from a position which is closest to the front in the Y-direction (the reference position) such that the mounting range of three times in the Y-direction is included in the movement range of the heater 39. In the example of FIG. 12B, the heater 39 is configured to be capable of shifting two times backward and six times to the left side from a position closest to the right side in the X-direction and closest to the front in the Y-direction (the reference position) such that the mounting range of seven times in the X-direction and three times in the Y-direction (a total of 21 times) is included in the movement range of the heater 39. The heater unit 35 (the heater 39) of the alternative embodiment is installed on a second base plate which is separate from the base plate 31, and the second base plate is configured to be capable of being lifted and lowered in the vertical direction and to be capable of moving in the horizontal direction independently of the base plate 31.

Figure 13:
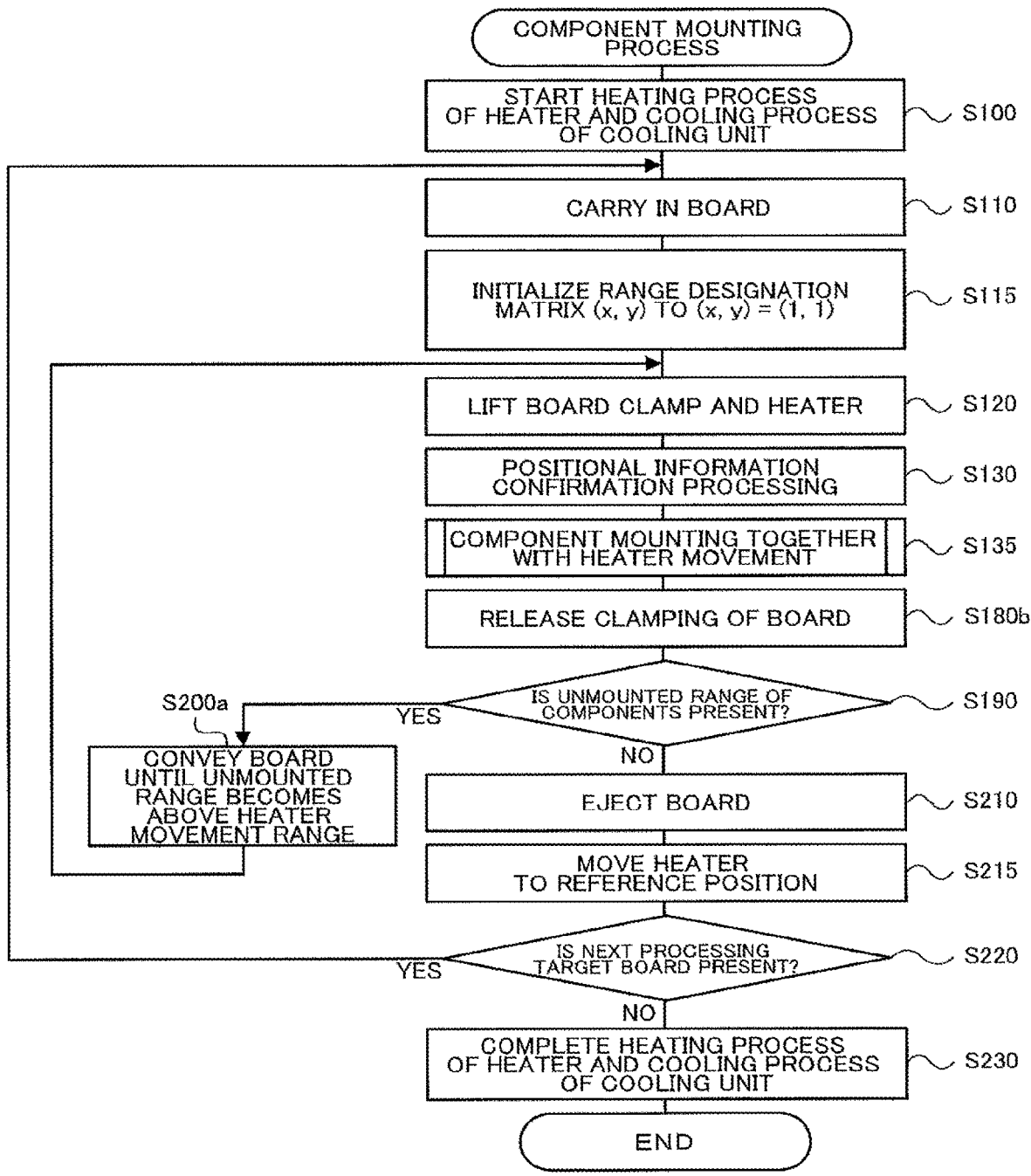
FIG. 13 is a flowchart illustrating a component mounting process of the alternative embodiment.

FIG. 13 is a flowchart illustrating the component mounting process routine of the alternative embodiment. In the flowchart of the alternative embodiment, processes which are the same as in the embodiment are given the same step numbers and detailed description will be omitted. When starting the component mounting process routine of FIG. 13, the heater 39 is present in the reference position, and the CPU 71 carries in the board S in S110 such that above the heater 39 which is in the reference position becomes the mounting range. After S110, the CPU 71 initializes a range designation matrix (x, y) which designates the mounting range to the value (1, 1) (S115).

Figure 14:
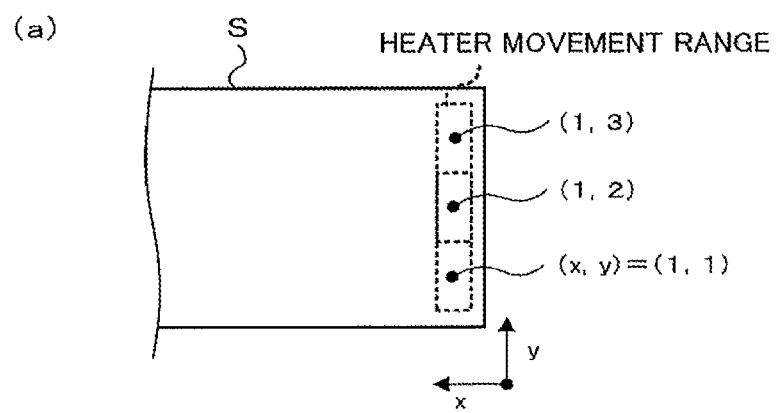
FIG. 14 is an explanatory diagram illustrating an example of a range designation matrix.
Figure 14:
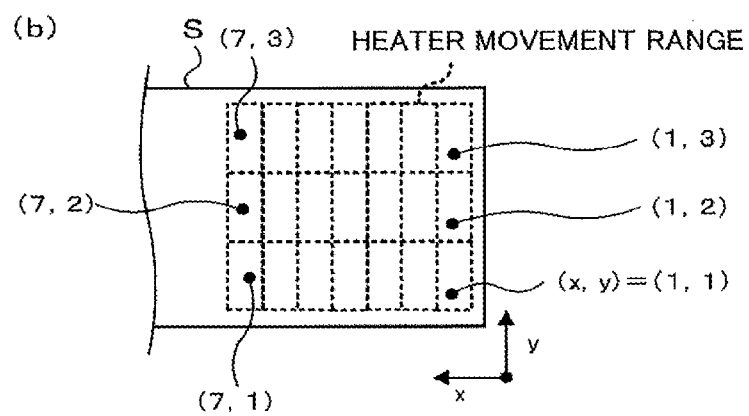

Here, the range designation matrix (x, y) designates the processing target mounting range among a plurality of matrix-form ranges obtained by dividing the movement range of the heater 39 by the mounting range. In a case in which the range designation matrix (x, y) is the value (1, 1), the range above the heater 39 which is in the reference position is designated as the mounting range among the plurality of matrix-form ranges. FIG. 14 is an explanatory diagram illustrating an example of a range designation matrix. FIG. 14A is a range designation matrix corresponding to FIG. 12A. Since the mounting range of three times in the Y-direction is included in the movement range of the heater 39 of FIG. 12A, the range designation matrix is set to one of the values (1, 3) from the value (1, 1). FIG. 14 (b) is a range designation matrix corresponding to FIG. 12(b). Since the mounting range of seven times in the X-direction and three times in the Y-direction within the movement range of the heater 39 is included in the movement range of the heater 39 of FIG. 12B, the range designation matrix is set to one of the values (7, 3) from the value (1, 1).

Figure 15:
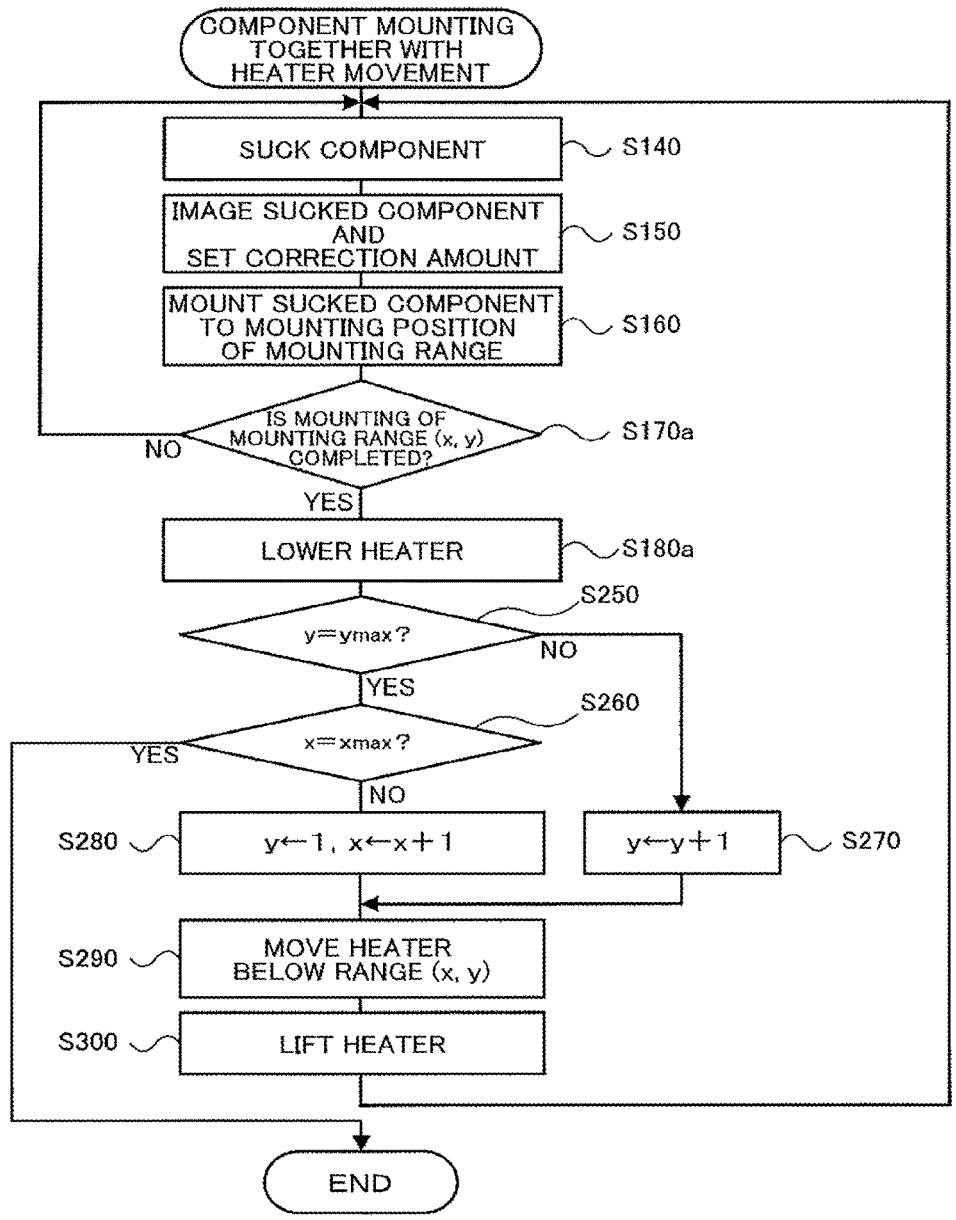
FIG. 15 is a flowchart illustrating component mounting which is carried out together with heater movement which is executed by the CPU 71 of the control device 70.

Next, the CPU 71 clamps the board S in S120 and causes the heater 39 to come into contact with the bottom surface of the board S, and after performing the positional information confirmation processing of S130, performs the component mounting which is carried out together with the heater movement illustrated in FIG. 15 (S135). As described later, in the alternative embodiment, since the board S remains clamped without being shifted when the mounting of components to the mounting ranges which are designated by the range designation matrix in the movement range of the heater 39 is not completed, ordinarily, the position of the board S does not change until the movement in the movement range of the heater 39 is completed. Therefore, the CPU 71 may perform the confirmation of the positional information of S135 on a range on the board S corresponding to the movement range of the heater 39. Therefore, in the alternative embodiment, the reference position marks Sa may be formed at least one for each of two corners which are opposing corners of the respective rectangular range on the board S corresponding to the movement range of the heater 39.

In the component mounting which is performed together with the heater movement of FIG. 15, the CPU 71 mounts a component in a mounting position in the processes of S140 to S160, determines whether or not the mounting of components in the mounting range which is designated by the range designation matrix (x, y) is completed (S170a), and if the mounting is not completed, repeats the processes of S140 to S170a. When the CPU 71 determines that the mounting of components is completed, the CPU 71 lowers the heater 39 (S180a), and determines whether or not a value y of the range designation matrix (x, y) is a maximum value y max (S250), and whether or not a value x is a maximum value x max (S260), respectively. When the CPU 71 determines that the value y is not the maximum value y max, the CPU 71 increments the value y by only 1 and updates the range designation matrix (x, y) (S270), moves the heater 39 to under the post-update range designation matrix (x, y) (S290), lifts the heater 39 (S300), and subsequently returns to S140 and repeats the processes. Accordingly, the CPU 71 sequentially shifts the heater 39 from the front to the rear in the Y-direction, and performs the mounting process of the components.

When the CPU 71 determines that the value y is the maximum value y max in S250, and determines that the value x is not the maximum value x max in S260, the CPU 71 sets the value y to a value of 1, increments the value x by only 1 and updates the range designation matrix (x, y) (S280), moves the heater 39 to under the post-update range designation matrix (x, y) (S290), lifts the heater 39 (S300), and subsequently returns to S140 and repeats the processes. Accordingly, when the CPU 71 causes the heater 39 to move to the most rear in the Y-direction of the movement range of the heater 39 to perform mounting of components, the CPU 71 shifts the heater 39 to a position of the left side in the X-direction (the downstream side in the board conveyance direction) and the most front in the Y-direction and performs the mounting process of components. When the CPU 71 determines that the value y is the maximum value y max in S250 and determines that the value x is the maximum value x max in S260, the CPU 71 assumes that the mounting of components for the entire mounting range which is possible to designate using the range designation matrix, that is, in the movement range of the heater 39 is completed, and completes the component mounting process.

When the CPU 71 causes the heater 39 to move such that each of the matrix-form ranges, which are obtained by dividing the movement range of the heater 39 in this manner, sequentially becomes the mounting range and performs the mounting process of components, the CPU 71 returns to the component mounting process routine of FIG. 13, releases the clamping of the board S in S180b, and determines whether or not an unmounted range of components is present on the board S in S190. When the CPU 71 determines that the unmounted range is present, the board S is conveyed until the unmounted range is above the movement range of the heater 39 (S200a), the CPU 71 returns to S120 and repeats the processes. When the CPU 71 determines that the unmounted range is not present, the board S is ejected in S210 and the heater 39 is caused to move to the reference position at which the range designation matrix (x, y) becomes the value (1, 1) (S215). When the CPU 71 determines that the board S which will serve as the next processing target is present in S220, the CPU 71 returns to S110 and repeats the processes. On the other hand, when the CPU 71 determines that the board S which will serve as the processing target is not present in S220, the CPU 71 completes the heating process of the heater 39 and completes the cooling process of the cooling unit 40 (S230), and ends the component mounting process routine.

In the alternative embodiment, the center position in the X-axis direction of the protruding section 33a may be caused to match the center position in the X-axis direction of the movement range of the heater 39 while setting a length Xc of the protruding section 33a of the clamp plate 33 to a length which is approximately the same as the length in the X-axis direction or to a length which is equal to or greater than the length in the X-axis direction in the movement range of the heater 39. By doing so, it is possible to reliably clamp the board S in the movement range of the heater 39 and accurately mount components, and it is possible to suppress the repeated clamping of the same location of the board S.

In the embodiment described above, only the protruding section 33a is formed on the upper surface of the clamp plate 33; however, the embodiment is not limited thereto, and the protruding section may not be formed. Alternatively, since, in the clamp plate 33, only the portion of the protruding section 33a clamps the board S, the clamp plate itself may be configured as a member in which the length in the X-axis direction is a length equivalent to the protruding section 33a.

In the embodiment described above, the vacuum unit 47 is provided on the downstream side in the board conveyance direction of the heater 39; however, the embodiment is not limited thereto, the vacuum unit 47 may be provided on the upstream side in the board conveyance direction of the heater 39, and may be provided on each of the upstream side and the downstream side in the board conveyance direction.

In the embodiment described above, the vacuum unit 47 is provided in a state in which the opening end 48a of the air suction pipe 48 is inclined to the side frame 22 side; however, the embodiment is not limited thereto, the vacuum unit 47 may be provided in a state in which the opening end 48a is inclined to a board support member 34 side, and the vacuum unit 47 may be provided in a state in which the opening end 48a directly faces the heater 39 side without being set to an inclined state.

In the embodiment described above, the air blower unit 44 is provided on the upstream side and the downstream side in the board conveyance direction of the heater 39; however, the embodiment is not limited thereto, the air blower unit 44 may be provided on only the upstream side in the board conveyance direction of the heater 39, and may be provided on only the downstream side in the board conveyance direction. It is possible to suppress the influence of the heat reaching the components which are mounted earlier by providing the air blower unit 44 on the downstream side in the board conveyance direction of the heater 39.

In the embodiment described above, the cooling unit 40 is provided with the premise that a partial range of the board S which is narrower than the movement range of the head 60 is heated by the heater 39; however, the embodiment is not limited thereto, and a configuration may be adopted in which the cooling unit is provided in a device which heats at least a partial range (including the entire range) of the board S using a heater. In other words, in a component mounting device which is provided with conveyance device for conveying a board, holding device for holding the board which is conveyed, and a heater which heats the board which is held, and mounts components onto the board while heating the board using the heater, the component mounting device may be provided with a base block on which the heater is installed via a thermally insulating material, and cooling medium circulation device for causing a cooling medium to circulate inside the base block, the component mounting device may be provided with suction device for sucking air in the periphery of the heater, and blowing device for blowing air toward the periphery of a portion of the board which is heated by the heater.

In the embodiment described above, the three units of the air circulation unit 41 which causes air to circulate in the air flow path inside the base block 36, the air blower unit 44 which blows air onto the board S, and vacuum unit 47 which sucks air in the vicinity of the heater unit 35 are provided as the cooling unit 40; however, the embodiment is not limited thereto, and either only one or two of these units may be provided. Alternatively, the cooling unit 40 may not be provided.

In the embodiment described above, a configuration is exemplified in which the heater unit 35 which performs the heating process as the specific process which uses the heater 39 is provided; however, the specific process is not limited to the heating process, and any process in which the mounting of components is necessary and which is performed from the bottom surface of the board S may be used. For example, a unit which performs an ultrasound generation process as the specific process is provided, and the mounting of components may be performed while applying ultrasound vibration to the board S. In this case, since the cooling unit 40 is not necessary, the cooling unit 40 may not be provided.

INDUSTRIAL APPLICABILITY

The present disclosure may be used in the manufacturing industry of component mounting devices, or the like.

REFERENCE SIGNS LIST

10: component mounting device, 12: main body frame, 15: component supply device, 20: board conveyance device, 22: side frame, 22a: horizontal section, 24: belt conveyor, 30: board holding device, 31: base plate, 32: lifting and lowering device, 33: clamp plate, 33a: protruding section, 34: board support member, 35: heater unit, 36: base block, 36a, 38a: cooling fin, 36b: air flow path, 37: thermally insulating material, 38: upper level block, 39: heater, 40: cooling unit, 41: air circulation unit, 42a: air supply pipe, 42b: air discharge pipe, 43, 46: air pump, 44: air blower unit, 44a: small hole, 45a: upstream-side blow pipe, 45b: downstream-side blow pipe, 47: vacuum unit, 48: air suction pipe, 48a: opening end, 49: suction pump, 50: moving mechanism, 51: X-axis guide rail, 52: X-axis slider, 53: Y-axis guide rail, 54: Y-axis slider, 60: head, 62: suction nozzle, 64: mark camera, 66: parts camera, 68: nozzle station, 70: control device, 71: CPU, 72: ROM, 73: HDD, 74: RAM, 75: input and output interface, 76: bus, 80: management device, 81: CPU, 82: ROM, 83: HDD, 84: RAM, 85: input and output interface, 86: bus, 87: input device, 88: display, S: board, Sa: reference position mark

The invention claimed is:

1. A component mounting device which mounts components onto a board using a head, comprising:
    a conveyor that conveys the board;
    a clamp member that holds the board which is conveyed; and
    a heater that moves within a specific movement range to apply heat under the board which is narrower than a movement range of the head and which is narrower than a mounting surface of the board;
    a base block on which the heater is installed via a thermally insulating material;
    a cooling medium circulation pump to circulate a cooling medium inside the base block; and
    a controller that repeats a mounting process and a shifting process until mounting of the components on the mounting surface is completed,
    wherein in the mounting process, the controller controls movement of the head and movement of the heater to mount the components using the specific movement range as a mounting range, wherein in the shifting process, the controller controls the conveyor and the clamp member to shift the mounting range by releasing the board, conveying the board, and subsequently holding the board, and wherein the heater partially heats the board.

2. The component mounting device according to claim 1, wherein the heater is configured such that the specific movement range is a fixed range that the heat is applied and which spans in a front-rear direction perpendicular to a conveyance direction of the board in the mounting surface, and wherein the controller performs the shifting process every time the mounting process in the mounting range is completed.

3. The component mounting device according to claim 2, wherein the clamp member partially clamps the board, and wherein the clamp member is formed such that a length in the conveyance direction in a portion which clamps the board is greater than or equal to a length in the conveyance direction in the specific movement range.

4. The component mounting device according to claim 1, wherein the heater is configured such that the specific movement range is in at least one of a conveyance direction of the board and a front-rear direction which is perpendicular to the conveyance direction, and wherein within the mounting range, the controller divides and sets the specific movement range into a plurality of mounting ranges, controls movement of the heater such that the mounting process is sequentially performed in each of the mounting ranges, and performs the shifting process when the mounting process is completed in all of the mounting ranges.

5. The component mounting device according to claim 4, wherein the clamp member partially clamps the board, and wherein the clamp member is formed such that a length in the conveyance direction in a portion which clamps the board is greater than or equal to a length in the conveyance direction in a range which in which the specific movement range of the heater moves.

6. The component mounting device according to claim 1, further comprising:

a first moving mechanism which causes the head to move in a conveyance direction of the board; and a second moving mechanism which causes the head to move in a front-rear direction which is perpendicular to the conveyance direction, wherein the controller controls the first moving mechanism and the second moving mechanism such that, after receiving a supply of the component, the head passes a predetermined position and moves to a mounting position of the component in the mounting process, and wherein when the head moves from the predetermined position to the mounting position, the specific movement range of the heater is defined such that both a movement direction of the head by the first moving mechanism and a movement direction of the head by the second moving mechanism become fixed directions.

7. The component mounting device according to claim 1, further comprising:

a vacuum that sucks air in a periphery of the heater.

8. The component mounting device according to claim 1, further comprising;

a blower that blows air toward a periphery of a portion of the board which is heated by the heater.

9. The component mounting device according to claim 1, wherein within the mounting range, the controller divides and sets the specific movement range into a plurality of mounting ranges, controls movement of the heater to move in a front-rear direction perpendicular to a conveyance direction of the board such that the mounting process is sequentially performed in each of the mounting ranges, and performs the shifting process when the mounting process is completed in all of the mounting ranges.

10. The component mounting device according to claim 1, wherein the heater is configured such that the specific movement range is in both of a conveyance direction of the board and a front-rear direction which is perpendicular to the conveyance direction.

11. The component mounting device according to claim 1, wherein the heater is configured such that the specific movement range is in both of a conveyance direction of the board and a front-rear direction which is perpendicular to the conveyance direction, and wherein within the mounting range, the controller divides and sets the specific movement range into a plurality of mounting ranges, controls movement of the heater such that the mounting process is sequentially performed in each of the mounting ranges, and performs the shifting process when the mounting process is completed in all of the mounting ranges.

* * * * *